(12) United States Patent
Tseng et al.

(10) Patent No.: US 12,243,838 B2
(45) Date of Patent: Mar. 4, 2025

(54) CIRCUIT SUBSTRATE STRUCTURE AND MANUFACTURING METHOD THEREOF

(71) Applicant: Unimicron Technology Corp., Taoyuan (TW)

(72) Inventors: Tzyy-Jang Tseng, Taoyuan (TW); Pu-Ju Lin, Hsinchu (TW); Cheng-Ta Ko, Taipei (TW); John Hon-Shing Lau, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 729 days.

(21) Appl. No.: 17/567,883

(22) Filed: Jan. 4, 2022

(65) Prior Publication Data

US 2022/0130781 A1    Apr. 28, 2022

Related U.S. Application Data

(63) Continuation-in-part of application No. 17/098,436, filed on Nov. 15, 2020, now Pat. No. 11,410,971.

(30) Foreign Application Priority Data

Aug. 20, 2020  (TW) ................................ 109128362
Nov. 10, 2021  (TW) ................................ 110141784

(51) Int. Cl.
  H01L 23/538     (2006.01)
  H01L 21/48      (2006.01)
  (Continued)

(52) U.S. Cl.
  CPC .......... H01L 24/06 (2013.01); H01L 21/4853 (2013.01); H01L 23/5381 (2013.01);
  (Continued)

(58) Field of Classification Search
  CPC  H01L 23/5381; H01L 25/0655; H01L 23/481
  See application file for complete search history.

(56) References Cited

U.S. PATENT DOCUMENTS 9,761,559 B1 *   9/2017  Shih ................... H01L 25/0652
2017/0365580 A1  12/2017  Shih et al.
(Continued)

FOREIGN PATENT DOCUMENTS

TW            M354298          4/2009

OTHER PUBLICATIONS

"Office Action of China Counterpart Application No. 202010841986. 0", issued on Oct. 24, 2024, p. 1-p. 8.

*Primary Examiner* — Errol V Fernandes
(74) *Attorney, Agent, or Firm* — JCIPRNET

(57) ABSTRACT

A circuit substrate structure includes a circuit substrate, at least two chips, and a bridge element. The circuit substrate has a first surface and a second surface opposite to each other. The chips are arranged in parallel on the first surface of the circuit substrate and electrically connected to the circuit substrate. The chips have active surfaces, back surfaces opposite to the active surfaces, and side surfaces connecting the active surfaces and the back surfaces. The chips include side circuits. The side circuits are arranged on the side surfaces and have first ends and second ends, the first ends extend to the active surfaces along the side surfaces, and the second ends extend to the back surfaces along the side surfaces. The bridge element is arranged on the back surfaces of the chips and electrically connected to the active surfaces of the chips through the side circuits.

15 Claims, 8 Drawing Sheets

(51) Int. Cl.
*H01L 23/00* (2006.01)
*H01L 25/00* (2006.01)
H01L 25/065 (2023.01)

(52) U.S. Cl.
CPC .............. *H01L 25/50* (2013.01); *H01L 24/03* (2013.01); *H01L 24/13* (2013.01); *H01L 24/16* (2013.01); *H01L 24/17* (2013.01); *H01L 25/0655* (2013.01); *H01L 2224/0346* (2013.01); *H01L 2224/06182* (2013.01); *H01L 2224/131* (2013.01); *H01L 2224/13147* (2013.01); *H01L 2224/16227* (2013.01); *H01L 2224/17181* (2013.01)

(56) References Cited

U.S. PATENT DOCUMENTS

| | | | |
|---|---|---|---|
| 2019/0164806 A1 | 5/2019 | Leobandung | |
| 2019/0295952 A1 | 9/2019 | Sikka et al. | |
| 2019/0385977 A1 | 12/2019 | Elsherbini et al. | |
| 2021/0134728 A1* | 5/2021 | Rubin | ................ H01L 21/4853 |

* cited by examiner

CIRCUIT SUBSTRATE STRUCTURE AND MANUFACTURING METHOD THEREOF

CROSS-REFERENCE TO RELATED APPLICATION

This application is a continuation-in-part application of and claims the priority benefit of U.S. application Ser. No. 17/098,436, filed on Nov. 15, 2020, now pending, which claims the priority benefit of Taiwan application serial no. 109128362, filed on Aug. 20, 2020. This application also claims the priority benefit of Taiwan application serial no. 110141784, filed on Nov. 10, 2021. The entirety of each of the above-mentioned patent applications is hereby incorporated by reference herein and made a part of this specification.

BACKGROUND

Technical Field

The disclosure relates to a substrate structure and a manufacturing method thereof; more particularly, the disclosure relates to a circuit substrate structure with multiple dies and a manufacturing method thereof.

Description of Related Art

At present, in a technical solution to integrate multiple chips by applying an embedded multi-die interconnect bridge (EMIB) technology, dimensions of micro bumps on a substrate and dimensions of micro bumps on the embedded interconnect bridge are different. Hence, when a chiplet is assembled to the substrate and the interconnect bridge, an issue of poor assembling yield is very much likely to arise. In addition, in a technical solution to integrate multiple chips by applying through silicon via (TSV) chips, the complicated TSV process leads to an increase in manufacturing costs of the chips.

SUMMARY

The disclosure provides a circuit substrate structure and a manufacturing method thereof, which may effectively increase an assembling yield or effectively reduce manufacturing costs of chips.

According to an embodiment of the disclosure, a circuit substrate structure including a circuit substrate, at least two chips, and a bridge element is provided. The circuit substrate has a first surface and a second surface opposite to each other. The at least two chips are arranged in parallel on the first surface of the circuit substrate and electrically connected to the circuit substrate. The at least two chips have active surfaces, back surfaces opposite to the active surfaces, and side surfaces connecting the active surfaces and the back surfaces. The at least two chips include side circuits. The side circuits are arranged on the side surfaces of the at least two chips and have first ends and second ends. Here, the first ends extend to the active surfaces along the side surfaces, and the second ends extend to the back surfaces along the side surfaces. The bridge element is arranged on the back surfaces of the at least two chips. The bridge element is electrically connected to the active surfaces of the at least two chips through the side circuits.

In an embodiment of the disclosure, the at least two chips include a plurality of pads. The pads are arranged on the back surfaces of the at least two chips and contact the second ends of the side circuits.

In an embodiment of the disclosure, the at least two chips further include a plurality of first connection elements. The first connection elements are arranged on the active surfaces of the at least two chips. A dimension of each of the first connection elements is substantially the same.

In an embodiment of the disclosure, the first connection elements include a plurality of first pads and a plurality of first solder bumps. The first pads are arranged on the active surfaces and contact the side circuits. The first solder bumps are arranged on the first pads. A dimension of each of the first solder bumps is substantially the same.

In an embodiment of the disclosure, the circuit substrate includes a plurality of third pads, a plurality of fourth pads, and a plurality of conductive terminals. The third pads are arranged on the first surface of the circuit substrate and contact the first solder bumps of the first connection elements. The fourth pads are arranged on the second surface of the circuit substrate. The conductive terminals are arranged on the fourth pads and electrically connected to the circuit substrate through the fourth pads.

In an embodiment of the disclosure, the bridge element includes a glass carrier, a redistribution circuit layer, and at least two second connection elements. The redistribution circuit layer is arranged on the glass carrier. Lines in the redistribution circuit layer are fine lines. The at least two second connection elements are arranged on the redistribution circuit layer and electrically connected to the redistribution circuit layer and the side circuits. A dimension of each of the at least two second connection elements is substantially the same.

In an embodiment of the disclosure, the at least two second connection elements include copper (Cu) pillars and second solder bumps. The Cu pillars are arranged on the redistribution circuit layer. The second solder bumps are arranged on the Cu pillars. The second solder bumps are electrically connected to the side circuits.

In an embodiment of the disclosure, in a normal direction of the circuit substrate, the bridge element overlaps a portion of the at least two chips.

In an embodiment of the disclosure, an orthogonal projection of the bridge element on the circuit substrate overlaps an orthogonal projection of the side circuits on the circuit substrate.

In an embodiment of the disclosure, the active surface of one of the at least two chips is levelled with the active surface of the other of the at least two chips, and the back surface of one of the at least two chips is levelled with the back surface of the other of the at least two chips.

According to an embodiment of the disclosure, a manufacturing method of a circuit substrate structure includes following steps. At least two chips are provided. The at least two chips have active surfaces, back surfaces opposite to the active surfaces, and side surfaces connecting the active surfaces and the back surfaces. The at least two chips include side circuits. The side circuits are arranged on the side surfaces of the at least two chips and have first ends and second ends. Here, the first ends extend to the active surfaces along the side surfaces, and the second ends extend to the back surfaces along the side surfaces. The bridge element is then arranged on the back surfaces of the at least two chips, so that the bridge element is electrically connected to the active surfaces of the at least two chips through the side circuits. A circuit substrate is provided. The circuit substrate has a first surface and a second surface opposite to each other. Finally, the at least two chips are arranged in parallel on the first surface of the circuit substrate, so as to be electrically connected to the circuit substrate.

In an embodiment of the disclosure, the manufacturing method of the bridge element includes following steps. A glass carrier is provided. A plurality of redistribution circuit layers is formed on a wafer or the glass carrier. Pitches exist among the redistribution circuit layers. Lines in the redistribution circuit layers are fine lines. At least two second connection elements are formed on each of the redistribution circuit layers, so as to be electrically connected to each of the redistribution circuit layers. A dimension of each of the at least two second connection elements is substantially the same. A thinning process is performed on the glass carrier. A singulation process is performed to form the bridge element.

In an embodiment of the disclosure, the manufacturing method further includes following steps. A plurality of conductive terminals is arranged on the second surface of the circuit substrate, so as to be electrically connected to the circuit substrate.

In view of the above, in the circuit substrate structure and the manufacturing method thereof provided herein, compared to the general technical solution to connect multiple chips through the complicated TSV process, the bridge element and the side circuits are applied to connect multiple chips according to one or more embodiments of the disclosure, which may effectively reduce the manufacturing cost of the chips.

To make the aforementioned more comprehensible, several embodiments accompanied with drawings are described in detail as follows.

BRIEF DESCRIPTION OF THE DRAWINGS

The accompanying drawings are included to provide a further understanding of the disclosure and are incorporated in and constitute a part of this specification. The drawings illustrate embodiments of the disclosure and, together with the description, serve to explain the principles of the disclosure.

DESCRIPTION OF THE EMBODIMENTS

Figure 1:
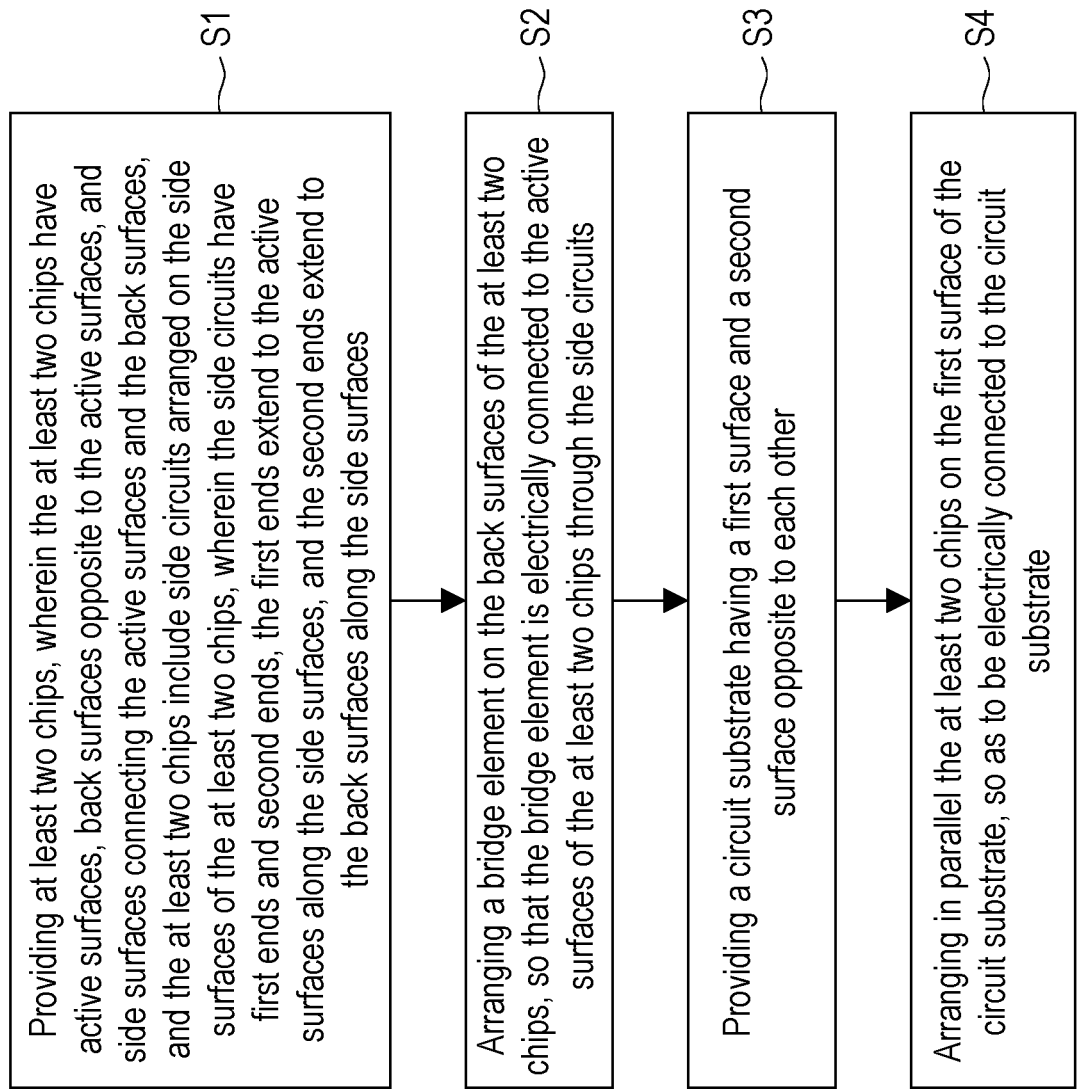
FIG. 1 is a flow chart illustrating a manufacturing method of a circuit substrate structure according to an embodiment of the disclosure.

Reference will now be made in detail to the exemplary embodiments of the disclosure, examples of which are illustrated in the accompanying drawings. Whenever possible, the same reference numerals are used to represent the same drawings or similar parts in the accompanying and description, and the description of the same technical content is omitted. The description of the omitted part may be derived from the previous embodiment and will not be repeated in the following embodiments.

Figure 2A:
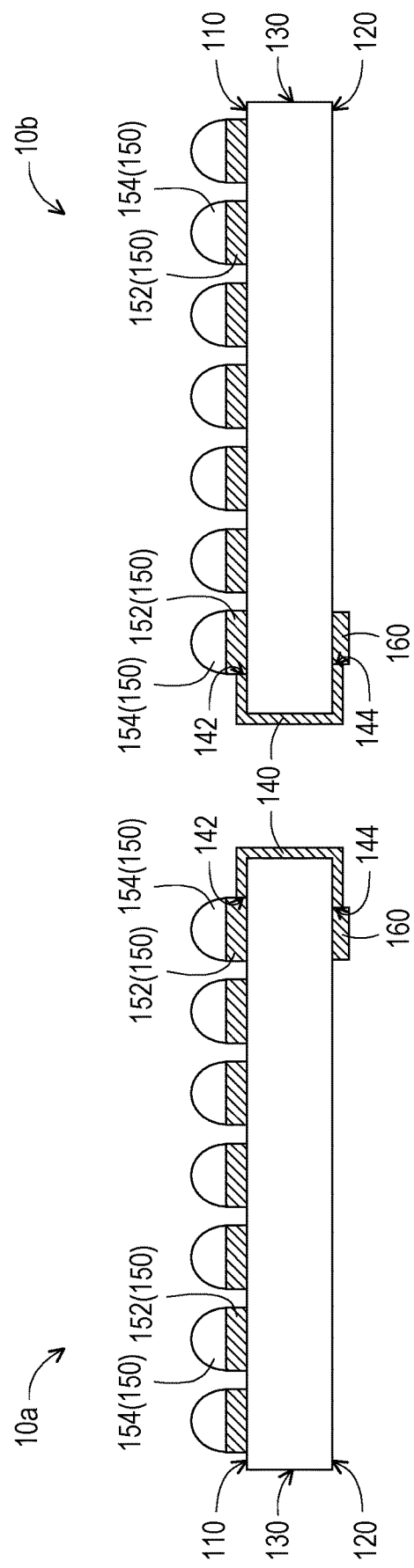
FIG. 2A to FIG. 2C are schematic cross-sectional views illustrating a manufacturing method of a circuit substrate structure according to an embodiment of the disclosure.
Figure 2B:
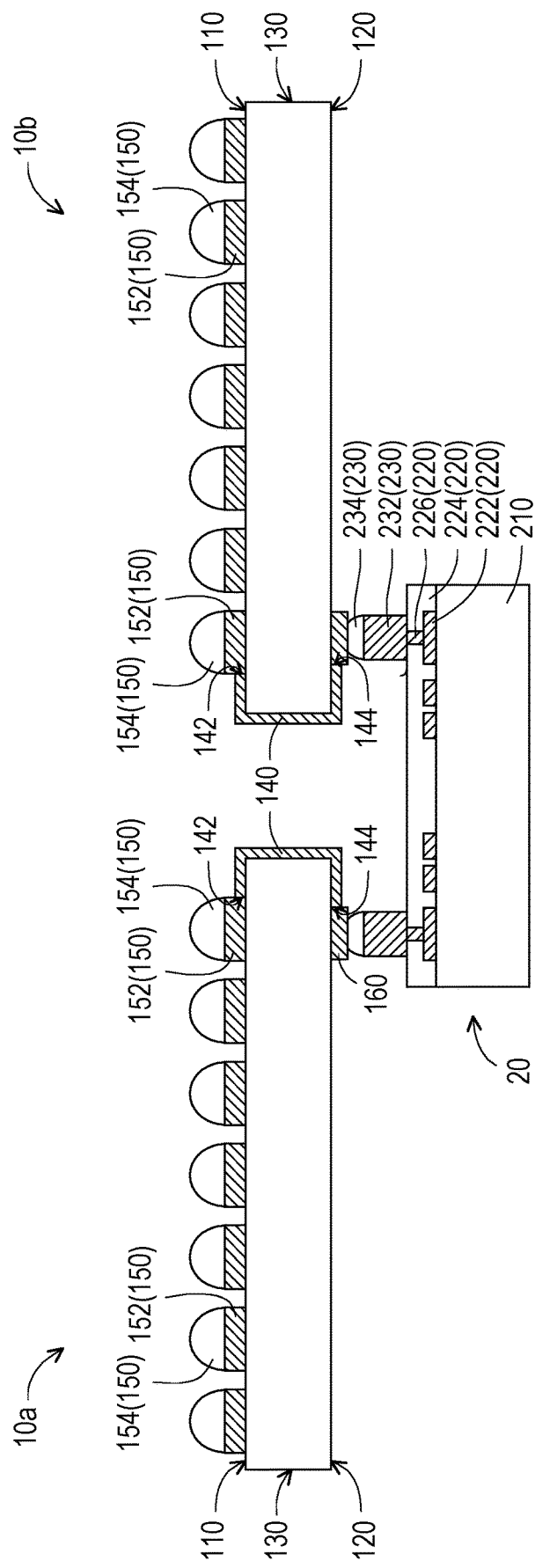
Figure 2C:
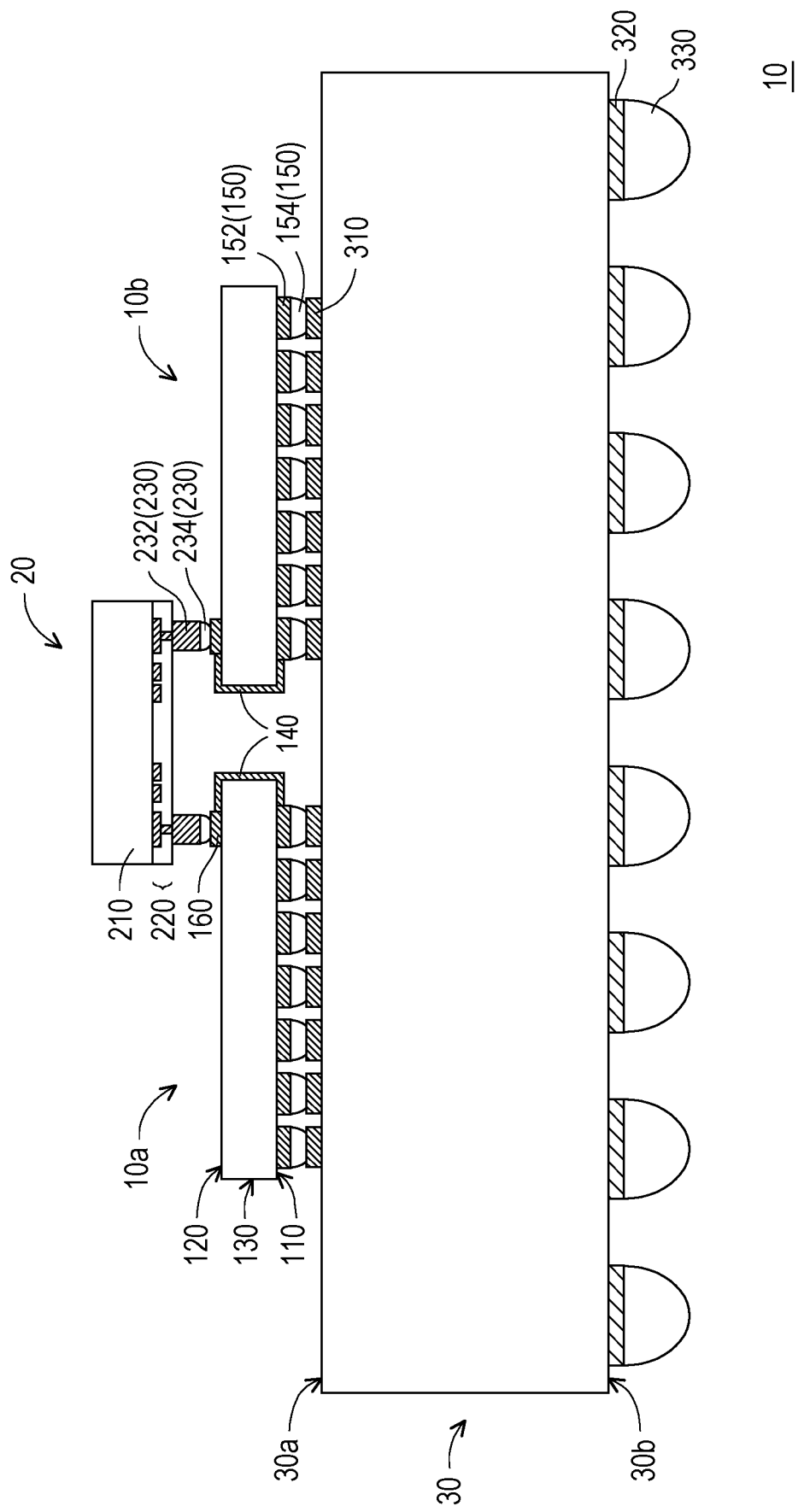
Figure 3A:
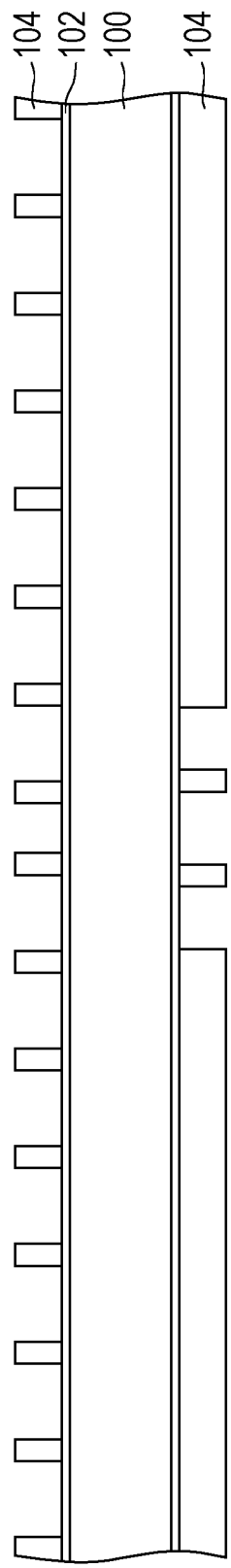
FIG. 3A to FIG. 3C are schematic cross-sectional views illustrating a manufacturing method of side circuits of chips according to an embodiment of the disclosure.
Figure 3B:
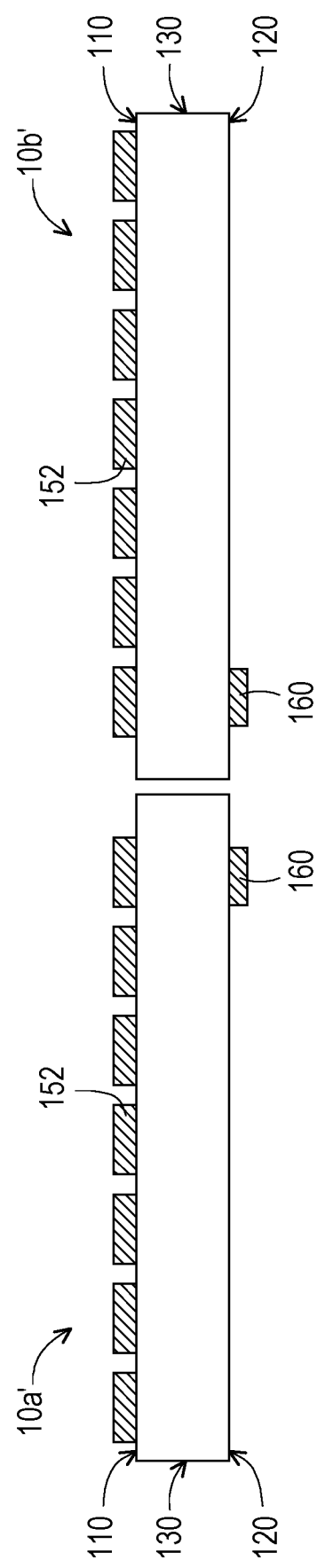
Figure 3C:
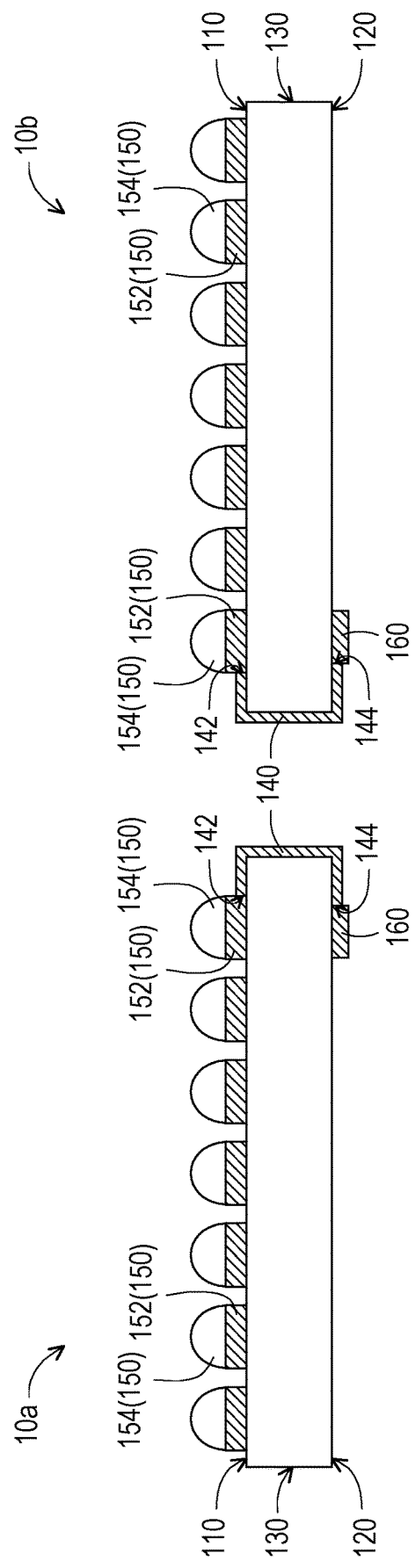

FIG. 1 is a flow chart illustrating a manufacturing method of a circuit substrate structure according to an embodiment of the disclosure. FIG. 2A to FIG. 2C are schematic cross-sectional views illustrating a manufacturing method of a circuit substrate structure according to an embodiment of the disclosure. FIG. 3A to FIG. 3C are schematic cross-sectional views illustrating a manufacturing method of side circuits of chips according to an embodiment of the disclosure. FIG. 4A to FIG. 4D are schematic cross-sectional views illustrating a manufacturing method of a bridge element according to an embodiment of the disclosure.

A manufacturing method of a circuit substrate structure 10 provided in this embodiment may include following steps:

First, with reference to FIG. 1 and FIG. 2A, step S1 is performed to provide at least two chips 10a and 10b. The chips 10a and 10b may each have an active surface 110, a back surface 120 opposite to the active surface 110, and a side surface 130 connecting the active surface 110 and the back surface 120. Here, the at least two chips 10a and 10b may be chips with different functions, such as a logic chip, a memory chip, a chiplet, or any other system on a chip (SoC), which should however not be construed as a limitation in the disclosure.

In this embodiment, the chips 10a and 10b may each include a side circuit 140, a plurality of first connection elements 150, and a pad 160. The side circuits 140 are arranged on the side surfaces 130 of the chips 10a and 10b, and the side circuits 140 each have a first end 142 and a second end 144. The first end 142 of the side circuit 140 may extend to the active surface 110 along the side surface 130, and the second end 144 of the side circuit 140 may extend to the back surface 120 along the side surface 130.

The first connection elements 150 are arranged on the active surfaces 110 of the chips 10a and 10b. In this embodiment, the first connection elements 150 include a plurality of first pads 152 and a plurality of first solder bumps 154. The first pads 152 are arranged on the active surfaces 110, and one of the first pads 152 may contact the first end 142 of the side circuit 140. The first solder bump 154 may be arranged on the first pads 152. In other words, the first solder bumps 154 and the chips 10a and 10b are respectively located on opposite sides of the first pads 152. Here, a material of the first pads 152 may be, for instance, copper, aluminum, or other suitable materials, and a material of the first solder bumps 154 may be, for instance, tin, tin-silver alloy, or other suitable materials, which should however not be construed as a limitation in the disclosure.

In this embodiment, the first connection elements 150 are constituted by the first pads 152 and the first solder bumps 154 and are embodied as controlled collapse chip connection (C4) bumps. In other embodiments, the first connection elements may also be chip connection (C2) bumps, which constituted by copper (Cu) pillars with barrier layers and solder bumps or other conductive connection elements, which should however not be construed as a limitation in the disclosure.

In this embodiment, a dimension of each of the first pads 152 is substantially the same, and a dimension of each of the first solder bumps 154 is also substantially the same, so that a dimension of each of the first connection elements 150 on the active surfaces 120 of the at least two chips 10a and 10b may also be substantially the same. Thereby, in subsequent processes, when the chips 10a and 10b are flipped over to be assembled to the circuit substrate 30 (as shown in FIG. 2C), the substantially the same dimension of the first connection elements 150 ensures good planarity, which may effectively improve an assembling yield.

The pads 160 are arranged on the back surfaces 120 and may contact the second ends 144 of the side circuits 140.

In this embodiment, a manufacturing method of the at least two chips 10a and 10b may include but is not limited to following steps.

With reference to FIG. 3A, a manufacturing method of a chip with a side circuit in this embodiment may include but is not limited to following steps. A wafer 100 is provided, and a seed layer 102 is formed on two opposite sides of the wafer 100 (e.g., a silicon wafer or any other appropriate wafer). A photoresist layer 104 is then formed on the seed layer 102 through, for instance, a lithography process or other suitable processes. Here, a material of the seed layer 102 is a metal layer with a single-layer structure or a composite-layer structure, and the material may be, for instance, copper, a copper layer on titanium, or any other suitable material, which should however not be construed as a limitation in the disclosure. A material of the photoresist layer 104 may be, for instance, positive photoresist, negative photoresist, or other suitable materials, which should however not be construed as a limitation in the disclosure.

With reference to FIG. 3B, a patterned circuit layer (which may include the first pads 152 and the pads 160) is formed on two opposite sides of the wafer 100 through plating, photoresist stripping (PR stripping), etching, or a combination of other suitable processes, and the photoresist layer 104 and a portion of the seed layer 102 (i.e., the seed layer 102 on which no patterned circuit layer is formed) directly below the photoresist layer 104 are removed. A singulation process is then performed to cut the wafer 100 into individual wafers 10a' and 10b'. Specifically, the chips 10a' and 10b' each have the active surface 110, the back surface 120 opposite to the active surface 110, and the side surface 130 connecting the active surface 110 and the back surface 120. The first pads 152 provided in the embodiment are arranged on the active surfaces 110 of the chips 10a' and 10b', and the pads 160 are arranged on the back surfaces 120 of the chips 10a' and 10b', which should however not be construed as a limitation in the disclosure. Here, the material of the patterned circuit layer is already elaborated above and will not be repeatedly explained hereinafter.

With reference to FIG. 3C, a side circuit 140 is formed on each of the individual chips 10a' and 10b'. Here, the first ends 142 of the side circuits 140 may extend to the active surfaces 110 along the side surfaces 130 of the chips 10a' and 10b' to directly contact the first pads 152. In addition, the second ends 144 of the side circuits 140 may extend to the back surfaces 120 along the side surfaces 130 of the chips 10a' and 10b' to directly contact the pads 160. The first solder bumps 154 are formed on the top of the first pads 152 (opposite to the active surfaces 120 of the chips 10a' and 10b') to form the first connection elements 150. So far, the chips 10a and 10b provided in this embodiment are completely formed.

With reference to FIG. 1 and FIG. 2B, step S2 is performed to arrange the bridge element 20 on the back surfaces 120 of the chips 10a and 10b, so that the bridge element 20 may be electrically connected to the active surfaces 110 of the chips 10a and 10b through the side circuits 140. According to this embodiment, in the step of arranging the bridge element 20 on the back surfaces 120 of the chips 10a and 10b, the back surface 120 of the chip 10a is bonded to the bridge element 20, and the back surface 120 of the chip 10b is then bonded to the bridge element 20, which should however not be construed as a limitation in the disclosure.

Specifically, the bridge element 20 includes a glass carrier 210, a redistribution circuit layer 220, and at least two second connection elements 230. The redistribution circuit layer 220 is arranged on the glass carrier 210. The redistribution circuit layer 220 includes a patterned circuit layer 222, a dielectric layer 224, and a conductive via 226. The patterned circuit layer 222 is arranged on the glass carrier 210. The dielectric layer 224 is arranged on the patterned circuit layer 222 to cover the glass carrier 210 and the patterned circuit layer 222. The conductive via 226 is connected to the patterned circuit layer 222 and penetrates the dielectric layer 224. In this embodiment, lines (i.e., the patterned circuit layer 222) in the redistribution circuit layer 220 are fine lines with a line width of about 2 micrometers (um) to 10 um and a line pitch of about 2 um to 10 um. The redistribution circuit layer 220 provided in the embodiment is illustrated to have the single-layer patterned circuit layer 222, the single-layer dielectric layer 224, and the single-layer conductive via 226, which should however not be construed as a limitation in the disclosure. In other embodiments, the redistribution circuit layer of the bridge element may include a multi-layer patterned circuit layer, a multi-layer dielectric layer, and a multi-layer conductive via stacked together.

At least two second connection elements 230 are arranged on the redistribution circuit layer 220, so as to be electrically connected to the redistribution circuit layer 220. The at least two second connection elements 230 include Cu pillars 232 with barrier layers (not shown) and second solder bumps 234. In other words, the second connection elements provided in this embodiment may be embodied as C2 bumps, which should however not be construed as a limitation in the disclosure. In other embodiments (not shown), the second connection elements may also be C4 bumps (constituted by pads and solder bumps) or other conductive connection elements, which should however not be construed as a limitation in the disclosure.

In this embodiment, the Cu pillars 232 are arranged on the redistribution circuit layer 220 and are in contact with the conductive vias 226. The second solder bumps 234 are arranged on the Cu pillars 232. In other words, the second solder bumps 234 and the redistribution circuit layer 220 are located on opposite sides of the Cu pillars 232, respectively. Here, a material of the Cu pillars 232 with the barrier layers may be, for instance, copper, and a material of the second solder bumps 234 may be, for instance, tin or tin and silver alloy, which should however not be construed as a limitation in the disclosure.

In this embodiment, the second solder bumps 234 of the at least two second connection elements 230 may contact the pads 160 on the back surfaces 120 of the chips 10a and 10b; therefore, the second solder bumps 234 may be electrically connected to the side circuits 140 through the pads 160, and the redistribution circuit layer 220 of the bridge element 20 may be electrically connected to the active surfaces 110 of the chips 10a and 10b sequentially through the at least two second connection elements 230, the pads 160, and the side circuits 140. In other words, the at least two second connection elements 230 may be electrically connected to the redistribution circuit layer 220 and the side circuits 140. According to this embodiment, the technical solution to integrate multiple chips may be carried out by applying the bridge element and the side circuits to connect the chips. Since the TSV process of the chips is more delicate and complicated than the side circuit process of the chips, the manufacturing costs of the chips may be effectively reduced according to this embodiment.

Besides, in this embodiment, since a dimension of each of the Cu pillars 232 in the at least two second connection elements 230 is substantially the same, and a dimension of each of the second solder bumps 234 in the at least two second connection elements 230 is substantially the same, a dimension of each of the second connection elements 230 may also be substantially the same, which ensures good planarity. Thereby, the bridge element may be easily bonded to multiple chips, which may effectively increase the assembling yield.

Figure 4A:
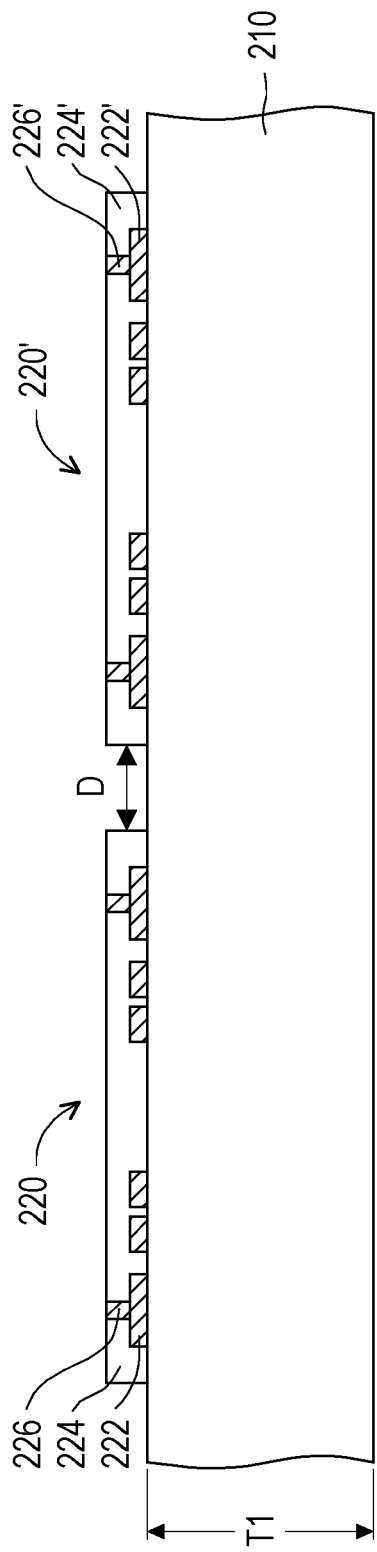
FIG. 4A to FIG. 4D are schematic cross-sectional views illustrating a manufacturing method of a bridge element according to an embodiment of the disclosure.

In this embodiment, a manufacturing method of the bridge element 20 may include but may not be limited to following steps, for instance. With reference to FIG. 4A, a glass carrier 210 is provided, and a plurality of redistribution circuit layers 220 and 220' is formed on a wafer or the glass carrier 210. A pitch D exists between the redistribution circuit layers 220 and 220'. The glass carrier 210 has a thickness T1. In addition, the compositions of the redistribution circuit layers 220 and 220' are the same, which has been described above and thus will not be further explained.

In particular, according to this embodiment, the glass carrier 210 acts as a carrier, and the redistribution circuit layer 220 is formed on the glass carrier 210, which should however not be construed as a limitation in the disclosure. In other embodiments, silicon wafer may also serve as a carrier to form the redistribution circuit layer 200, which should however not be construed as a limitation in the disclosure. As long as the surface of the resultant carrier has good planarity, may be applied to form fine lines, and has sufficient strength to support the bonding operation of multiple chips and the subsequent thinning process, the carrier may then be used as the carrier of the bridge element.

Figure 4B:
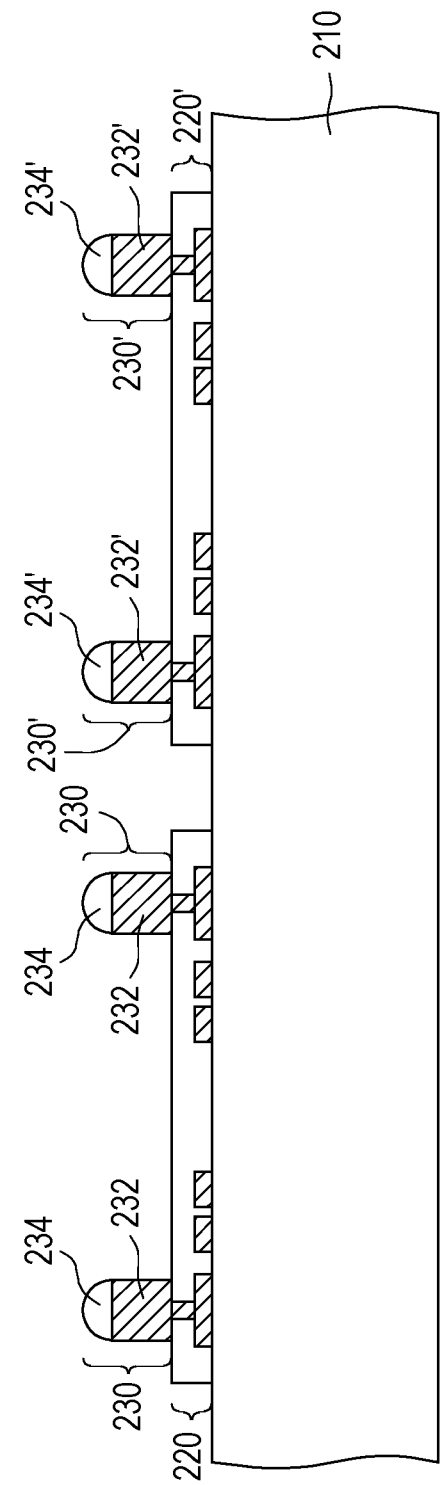

With reference to FIG. 4B, at least two second connection elements 230 are formed on the redistribution circuit layer 220, so that the at least two second connection elements 230 may be electrically connected to the redistribution circuit layer 220; at least two second connection elements 230' are formed on the redistribution circuit layer 220', so that the at least two second connection elements 230' may be electrically connected to the redistribution circuit layer 220'. Compositions of the second connection elements 220 and 220' are the same, which has been described above and thus will not be further explained.

Figure 4C:
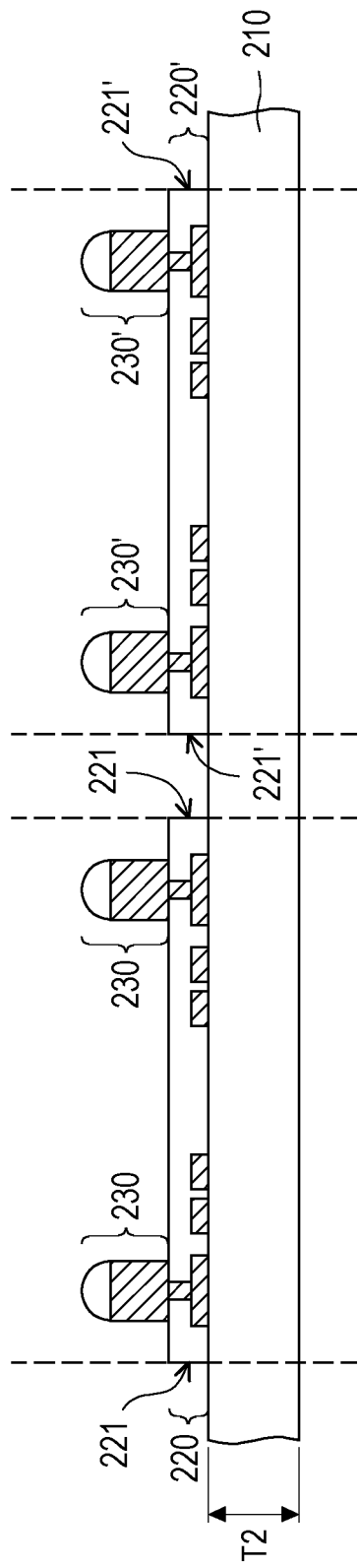

With reference to FIG. 4C, a thinning process is performed on the glass carrier 210, so that a thickness of the thinned glass carrier 210 is T2. In detail, the thinning process may be performed on the surface of the glass carrier 210 opposite to the redistribution circuit layers 220 and 220' through chemical-mechanical planarization (CMP), for instance; here, the thickness T2 is less than the thickness T1.

Figure 4D:
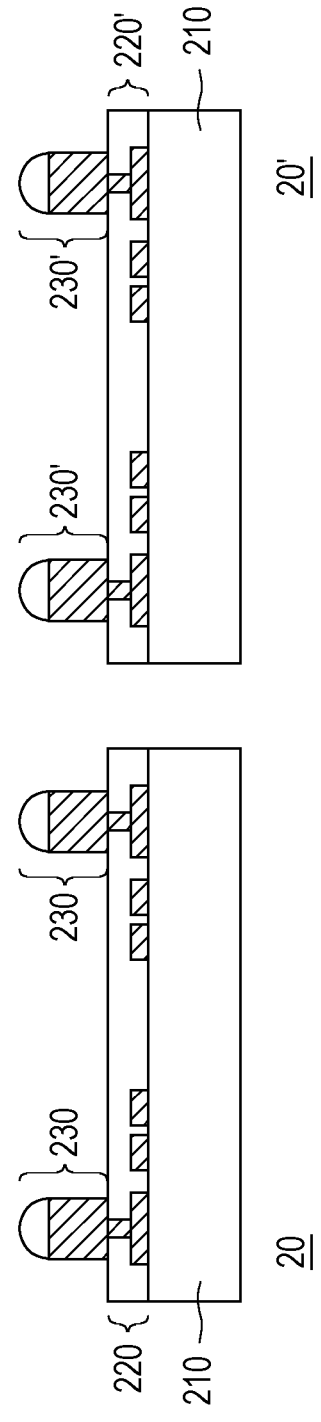

With reference to FIG. 4D, a singulation process is performed to form bridge elements 20 and 20'. Specifically, the glass carrier 210 is cut along a side 221 of the redistribution circuit layer 220 and a side 221' of the redistribution circuit layer 220', for instance, so as to form the separate bridge elements 20 and 20'. So far, the bridge elements 20 and 20' provided in this embodiment are completely formed.

With reference to FIG. 1 and FIG. 2C, step S3 is performed to provide the circuit substrate 30. The circuit substrate 30 has a first surface 30a and a second surface 30b opposite to each other. The circuit substrate 30 includes a plurality of third pads 310, a plurality of fourth pads 320, and a plurality of conductive terminals 330. The third pads 310 are arranged on the first surface 30a of the circuit substrate 30. The fourth pads 320 are arranged on the second surface 30b of the circuit substrate 30. The conductive terminals 330 are arranged on the fourth pads 320. The circuit substrate 30 and the conductive terminals 330 are located on opposite sides of the fourth pads 320, respectively. The conductive terminals 330 may be electrically connected to the circuit substrate 30 through the fourth pads 320.

With reference to FIG. 1 and FIG. 2C, step S4 is performed to arrange in parallel the at least two chips 10a and 10b on the first surface 30a of the circuit substrate 30, so that the at least two chips 10a and 10b may be electrically connected to the circuit substrate 30. Specifically, the chips 10a and 10b are adjacently arranged, and there is no intervening chip or element (including the passive element) between the chips 10a and 10b. The active surface 110 of the chip 10a is levelled with the active surface 110 of the chip 10b, and the back surface 120 of the chip 10a is levelled with the back surface 120 of the chip 10b.

In this embodiment, since the first connection elements 150 of the at least two chips 10a and 10b may contact the third pads 310 of the circuit substrate 30; therefore, the at least two chips 10a and 10b may be electrically connected to the circuit substrate 30 through the first connection elements 150 and the third pads 310.

In addition, according to this embodiment, in a normal direction of the circuit substrate 30, the bridge element 20 may overlap a portion of the at least two chips 10a and 10b. In this embodiment, an orthogonal projection of the bridge element 20 on the circuit substrate 30 may overlap an orthogonal projection of the side circuits 140 on the circuit substrate 30. So far, the circuit substrate structure 10 provided in this embodiment is completely formed.

In short, the circuit substrate structure 10 provided in this embodiment may include the circuit substrate 30, the at least two chips 10a and 10b, and the bridge element 20. The circuit substrate 30 has the first surface 30a and the second surface 30b opposite to each other. The at least two chips 10a and 10b are arranged in parallel on the first surface 30a of the circuit substrate 30 and connected to the circuit substrate 30. The at least two chips 10a and 10b have the active surfaces 110, the back surfaces 120 opposite to the active surfaces 110, and the side surfaces 130 connecting the active surfaces 110 and the back surfaces 120. The at least two chips 10a and 10b include the side circuits 140. The side circuits 140 are arranged on the side surfaces 130 of the at least two chips 10a and 10b. The side circuits 140 have the first ends 142 and the second ends 144. The first ends 142 extend to the active surfaces 110 along the side surfaces 130, and the second ends 144 extend to the back surfaces 120 along the side surfaces 130. The bridge element 20 is arranged on the back surfaces 120 of the at least two chips 10a and 10b. The bridge element 20 is electrically connected to the active surfaces 110 of the at least two chips 10a and 10b through the side circuits 140.

To sum up, in the circuit substrate structure and the manufacturing method thereof, compared to the general technical solution to connect multiple chips through the complicated TSV process, the bridge element and the side circuits are applied to connect multiple chips according to one or more embodiments of the disclosure, which may effectively reduce the manufacturing costs of the chips. In addition, since the dimension of each of the at least two second connection elements of the bridge element may be substantially the same, the bridge element may provide good planarity, so that the at least two chips may be easily bonded or assembled to the bridge element, thereby effectively improving the bonding or assembling yield. Besides, since the dimension of each of the first connection elements of the at least two chips may be substantially the same, the at least two chips may provide good planarity, so that the at least two chips may be easily bonded or assembled to the circuit substrate, thereby effectively improving the bonding or assembling yield.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A circuit substrate structure, comprising:
   a circuit substrate, having a first surface and a second surface opposite to each other;
   at least two chips, arranged in parallel on the first surface of the circuit substrate and electrically connected to the circuit substrate, wherein the at least two chips have active surfaces, back surfaces opposite to the active surfaces, and side surfaces connecting the active surfaces and the back surfaces, and the at least two chips comprise:
      side circuits, arranged on the side surfaces of the at least two chips and having first ends and second ends, wherein the first ends extend to the active surfaces along the side surfaces, and the second ends extend to the back surfaces along the side surfaces; and
   a bridge element, arranged on the back surfaces of the at least two chips and electrically connected to the active surfaces of the at least two chips through the side circuits.

2. The circuit substrate structure according to claim 1, wherein the at least two chips comprise a plurality of pads arranged on the back surfaces of the at least two chips and contacting the second ends of the side circuits.

3. The circuit substrate structure according to claim 1, wherein the at least two chips comprise a plurality of first connection elements arranged on the active surfaces of the at least two chips, and a dimension of each of the first connection elements is substantially the same.

4. The circuit substrate structure according to claim 3, wherein the first connection elements comprise:
   a plurality of first pads, arranged on the active surfaces and contacting the side circuits; and
   a plurality of first solder bumps, arranged on the first pads, wherein a dimension of each of the first solder bumps is substantially the same.

5. The circuit substrate structure according to claim 4, wherein the circuit substrate comprises:
   a plurality of third pads, arranged on the first surface of the circuit substrate and contacting the first solder bumps of the first connection elements;
   a plurality of fourth pads, arranged on the second surface of the circuit substrate; and
   a plurality of conductive terminals, arranged on the fourth pads and electrically connected to the circuit substrate through the fourth pads.

6. The circuit substrate structure according to claim 1, wherein the bridge element comprises:
   a glass carrier;
   a redistribution circuit layer, arranged on the glass carrier, wherein lines in the redistribution circuit layer are fine lines; and
   at least two second connection elements, arranged on the redistribution circuit layer and electrically connected to the redistribution circuit layer and the side circuits, wherein a dimension of each of the at least two second connection elements is substantially the same.

7. The circuit substrate structure according to claim 6, wherein the at least two second connection elements comprise:
   copper pillars, arranged on the redistribution circuit layer; and
   second solder bumps, arranged on the copper pillars and electrically connected to the side circuits.

8. The circuit substrate structure according to claim 1, wherein in a normal direction of the circuit substrate, the bridge element overlaps a portion of the at least two chips.

9. The circuit substrate structure according to claim 1, wherein an orthogonal projection of the bridge element on the circuit substrate overlaps an orthogonal projection of the side circuits on the circuit substrate.

10. The circuit substrate structure according to claim 1, wherein the active surface of one of the at least two chips is levelled with the active surface of the other of the at least two chips, and the back surface of one of the at least two chips is levelled with the back surface of the other of the at least two chips.

11. A manufacturing method of a circuit substrate structure, comprising:
    providing at least two chips, wherein the at least two chips have active surfaces, back surfaces opposite to the active surfaces, and side surfaces connecting the active surfaces and the back surfaces, and the at least two chips comprise:
       side circuits, arranged on the side surfaces of the at least two chips and having first ends and second ends, wherein the first ends extend to the active surfaces along the side surfaces, and the second ends extend to the back surfaces along the side surfaces;
    arranging a bridge element on the back surfaces of the at least two chips, so that the bridge element is electrically connected to the active surfaces of the at least two chips through the side circuits;
    providing a circuit substrate, wherein the circuit substrate has a first surface and a second surface opposite to each other; and
    arranging the at least two chips in parallel on the first surface of the circuit substrate, so that the at least two chips are electrically connected to the circuit substrate.

12. The manufacturing method according to claim 11, wherein the at least two chips comprise a plurality of first connection elements arranged on the active surfaces of the at least two chips, and a dimension of each of the first connection elements is substantially the same.

13. The manufacturing method according to claim 12, wherein the first connection elements comprise:
    a plurality of first pads, arranged on the active surfaces and contacting the side circuits; and
    a plurality of first solder bumps, arranged on the first pads, wherein a dimension of each of the first solder bumps is substantially the same.

14. The manufacturing method according to claim 10, wherein a manufacturing method of the bridge element comprises:
    providing a glass carrier;
    forming a plurality of redistribution circuit layers on the glass carrier, wherein a pitch exists among the redistribution circuit layers, and lines in the redistribution circuit layers are fine lines;
    forming at least two second connection elements on each of the redistribution circuit layers, so that the at least two second connection elements are electrically connected to the each of the redistribution circuit layers, wherein a dimension of each of the at least two second connection elements is substantially the same;
    performing a thinning process on the glass carrier; and
    performing a singulation process to form the bridge element.

15. The manufacturing method according to claim 14, wherein the at least two second connection elements comprise:
- copper pillars, arranged on the redistribution circuit layers; and
- second solder bumps, arranged on the copper pillars and electrically connected to the side circuits.

\* \* \* \* \*